(12) United States Patent
Kung et al.

(10) Patent No.: US 11,848,705 B2
(45) Date of Patent: Dec. 19, 2023

(54) OPTICAL TRANSCEIVER WITH EXPOSED HEAT SPREADER AND OPTICAL COMMUNICATION DEVICE HAVING THE SAME

(71) Applicant: Prime World International Holdings Ltd., New Taipei (TW)

(72) Inventors: Ling-An Kung, New Taipei (TW); Hsuan-Chen Shiu, New Taipei (TW); Guang-Kai Wu, New Taipei (TW)

(73) Assignee: Prime World International Holdings Ltd., New Taipei (TW)

( * ) Notice: Subject to any disclaimer, the term of this patent is extended or adjusted under 35 U.S.C. 154(b) by 10 days.

(21) Appl. No.: 17/361,301

(22) Filed: Jun. 28, 2021

(65) Prior Publication Data

US 2022/0416898 A1    Dec. 29, 2022

(51) Int. Cl.
*H04B 10/40* (2013.01)
*G02B 6/42* (2006.01)
*H05K 7/20* (2006.01)

(52) U.S. Cl.
CPC .......... *H04B 10/40* (2013.01); *G02B 6/4269* (2013.01); *G02B 6/4272* (2013.01); *G02B 6/4277* (2013.01); *H05K 7/20445* (2013.01)

(58) Field of Classification Search
CPC ............................. H04B 10/40; H05K 7/20154
See application file for complete search history.

(56) References Cited

U.S. PATENT DOCUMENTS

| | | | | |
|---|---|---|---|---|
| 5,047,835 A | * | 9/1991 | Chang | H01L 31/0203 385/33 |
| 7,281,864 B2 | * | 10/2007 | Mizue | G02B 6/4256 398/139 |
| 11,271,348 B1 | * | 3/2022 | Chen | H01R 12/724 |
| 2006/0140551 A1 | * | 6/2006 | Yu | G02B 6/4267 385/92 |
| 2009/0123157 A1 | * | 5/2009 | Moore | G02B 6/4277 361/748 |
| 2017/0336583 A1 | * | 11/2017 | Chen | H04B 10/50 |
| 2019/0115684 A1 | * | 4/2019 | Khazen | G02B 6/4446 |
| 2020/0333543 A1 | * | 10/2020 | Oki | G02B 6/428 |
| 2021/0072472 A1 | * | 3/2021 | Curtis | G02B 6/4278 |
| 2021/0072473 A1 | * | 3/2021 | Wall, Jr. | H05K 1/0274 |
| 2021/0157074 A1 | * | 5/2021 | Lin | H05K 7/20427 |
| 2022/0248561 A1 | * | 8/2022 | Mao | G02B 6/4269 |

* cited by examiner

*Primary Examiner* — Pranesh K Barua
(74) *Attorney, Agent, or Firm* — Grossman Tucker Perreault Pfleger, PLLC

(57) ABSTRACT

An optical transceiver includes a housing, a heat source accommodated in the housing, and a heat spreader. The heat spreader includes a heat transfer portion accommodated in the housing and a heat dissipation portion exposed to outside. The heat spreader is in thermal contact with the heat source, and the heat dissipation portion of the heat spreader is in proximity of an optical port of the housing.

14 Claims, 9 Drawing Sheets

OPTICAL TRANSCEIVER WITH EXPOSED HEAT SPREADER AND OPTICAL COMMUNICATION DEVICE HAVING THE SAME

BACKGROUND

1. Technical Field

The present disclosure relates to optical communication, more particularly to an optical transceiver.

2. Related Art

Optical transceivers are generally installed in electronic communication facilities in modern high-speed communication networks. In order to make flexible the design of an electronic communication facility and less burdensome the maintenance of the same, an optical transceiver is inserted into a corresponding cage that is disposed in the communication facility in a pluggable manner. In order to define the electrical-to-mechanical interface of the optical transceiver and the corresponding cage, different form factors such as XFP (10 Gigabit Small Form Factor Pluggable) used in 10 GB/s communication rate, QSFP (Quad Small Form-factor Pluggable), or others at different communication rates have been made available.

As to the optical components in a conventional optical transceiver, a circuit board is disposed in a housing, and a TOSA (Transmitter optical sub-assembly) as well as a ROSA (Receiver optical sub-assembly) are mounted on the circuit board.

BRIEF DESCRIPTION OF THE DRAWINGS

The present disclosure will become more fully understood from the detailed description given below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
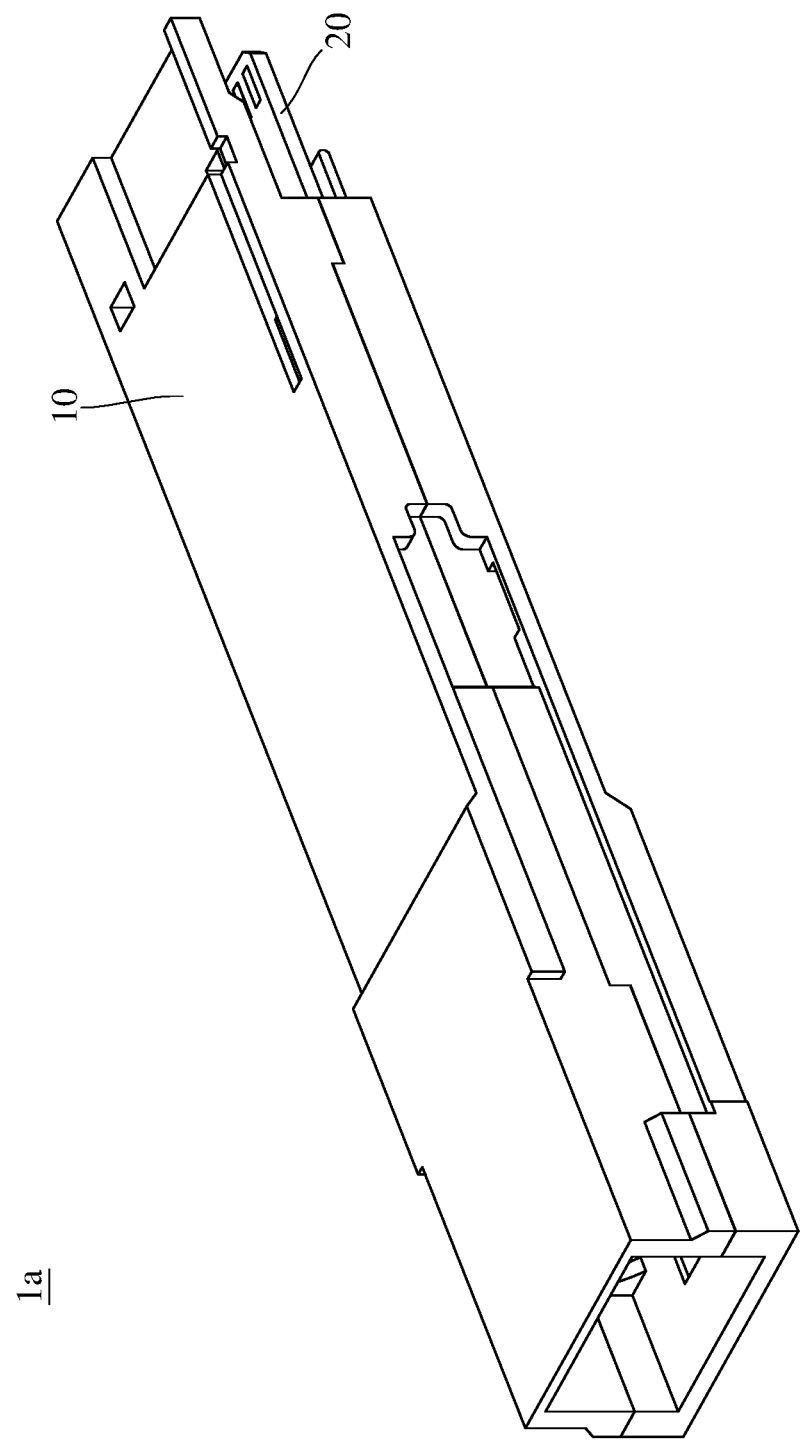
FIG. 1 is an exploded view of an optical transceiver according to an embodiment of the present disclosure.
Figure 2:
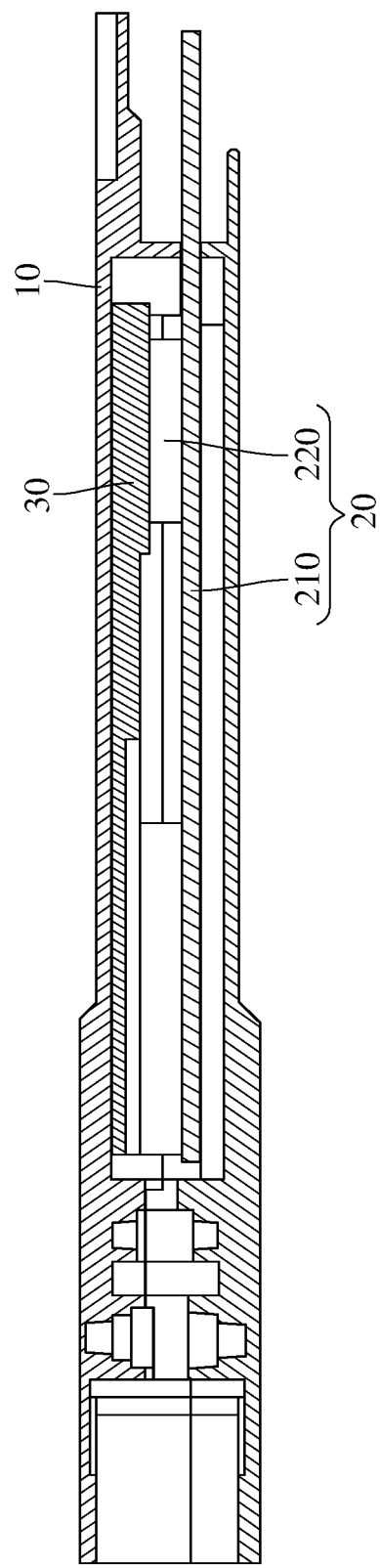
FIG. 2 is a cross-sectional view of the optical transceiver in FIG. 1.

Please refer to FIG. 1 and FIG. 2. FIG. 1 is an exploded view of an optical transceiver according to an embodiment of the present disclosure. FIG. 2 is a cross-sectional view of the optical transceiver in FIG. 1. In this embodiment, an optical transceiver 1a may include a housing 10, a circuit board 20 and a heat spreader 30.

The housing 10 may be configured to be inserted into a cage in pluggable manner for optical communication. The circuit board 20 is accommodated in the housing 10, and may include a substrate 210 and a heat source 220. The heat source 220 is mounted on the substrate 210. The heat source 220 may be a vertical cavity surface emitting laser operating as an active component in TOSA, a photodiode functioning as an active component in ROSA, or a high power IC chip which generates a large amount of heat during its operation. It is worth noting that the heat source 220 is not limited by embodiments discussed in the present disclosure. The heat spreader 30 may be a metal plate or a metal block disposed in the housing 10. The heat spreader 30 may be in thermal contact with the housing 10 and the heat source 220 of the circuit board 20. The heat spreader 30 could help the heat dissipation generated by the heat source 220 of the circuit board 20 so as to cool down the optical transceiver 1a.

Figure 3:
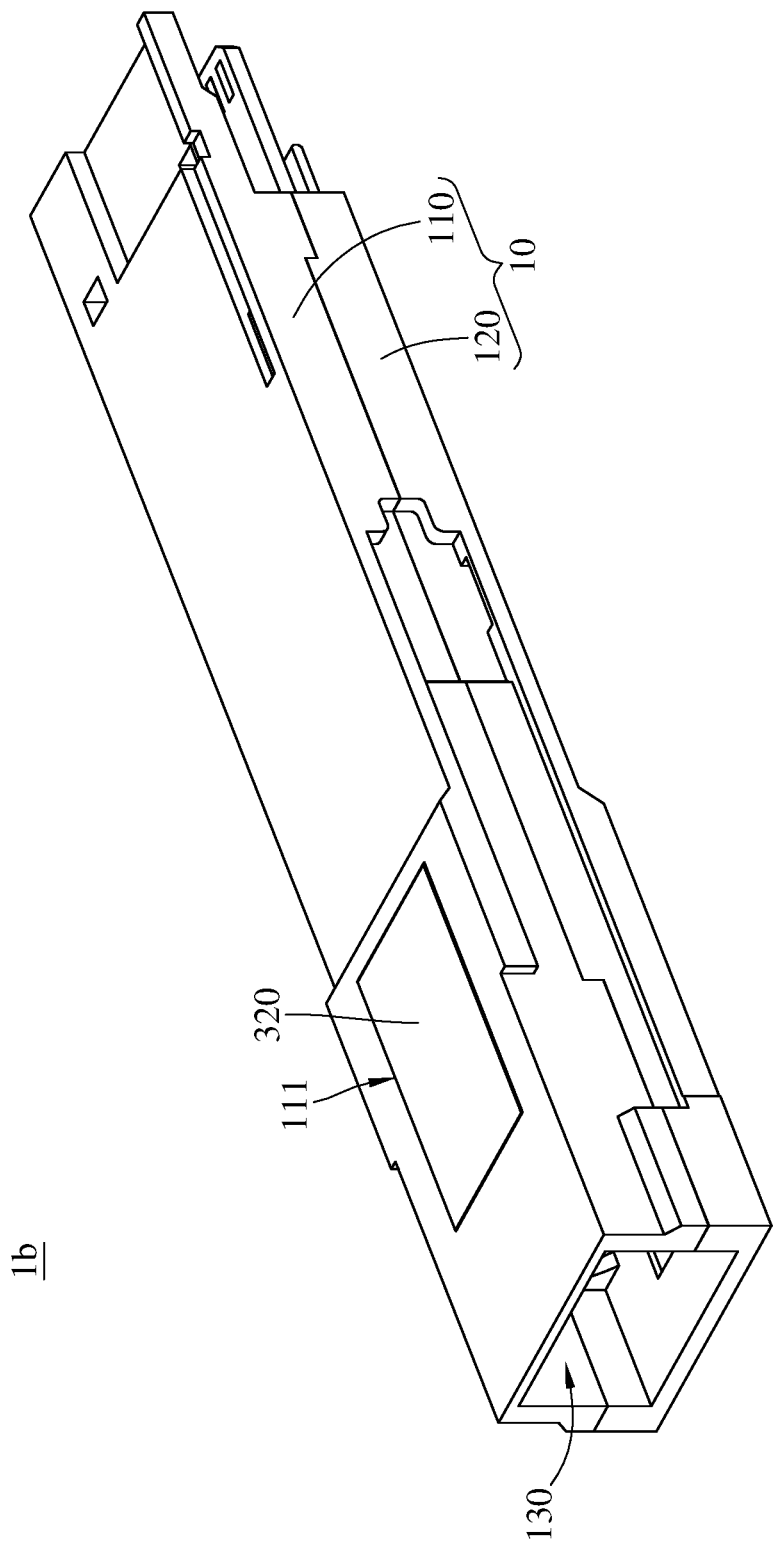
FIG. 3 is a perspective view of an optical transceiver according to another embodiment of the present disclosure.
Figure 4:
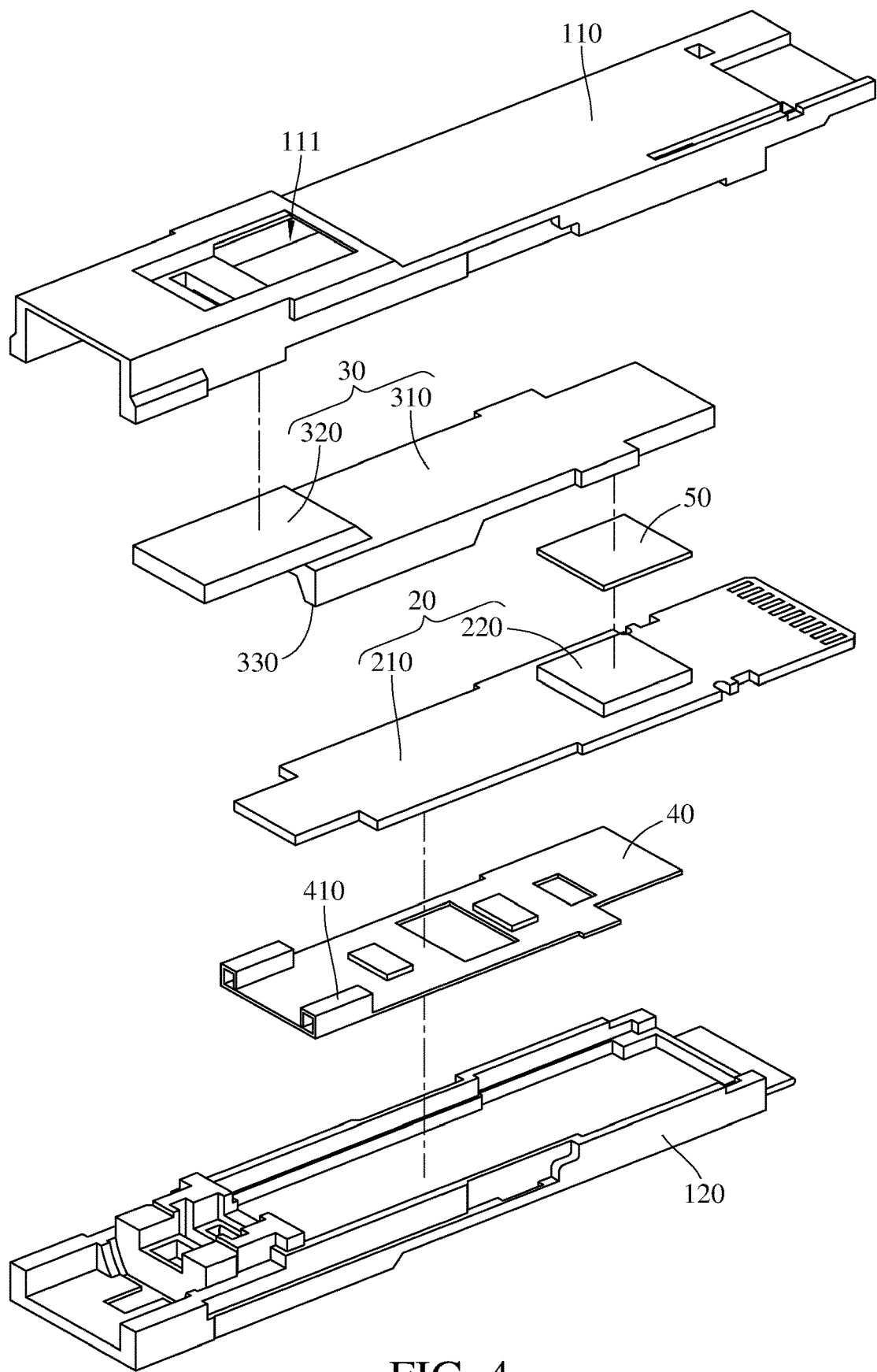
FIG. 4 is an exploded view of the optical transceiver in FIG. 3.
Figure 5:
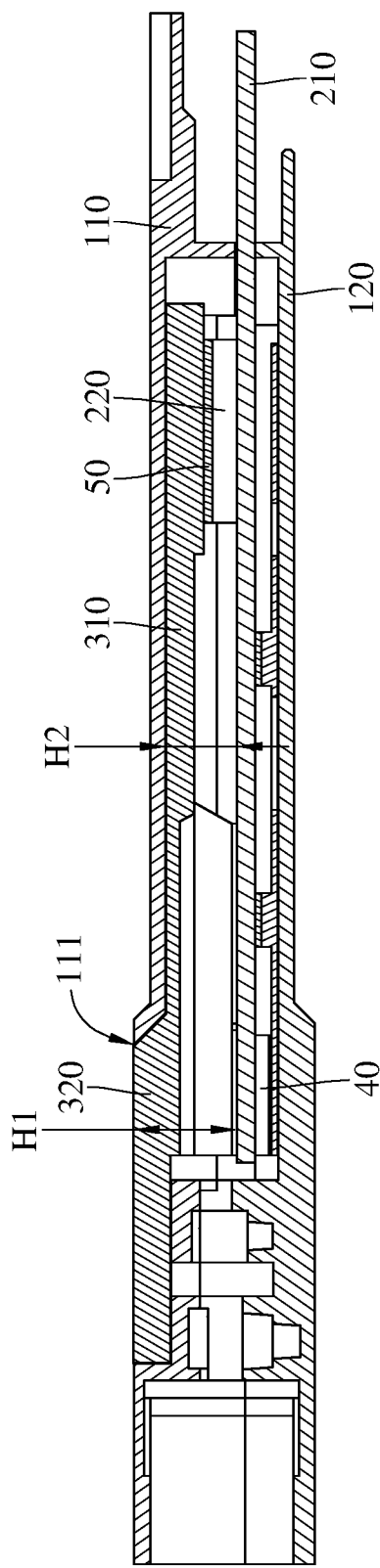
FIG. 5 is a cross-sectional view of the optical transceiver in FIG. 3.

Please refer to FIG. 3 through FIG. 5. FIG. 3 is a perspective view of an optical transceiver according to another embodiment of the present disclosure. FIG. 4 is an exploded view of the optical transceiver in FIG. 3. FIG. 5 is a cross-sectional view of the optical transceiver in FIG. 3. In this embodiment, an optical transceiver 1b may include a housing 10, a circuit board 20, a first heat spreader 30 and a second heat spreader 40.

The housing 10 may include an upper casing 110 and a lower casing 120 assembled with each other. The housing 10 may be inserted into a corresponding cage in a pluggable manner. An opening 111 of the upper casing 110 is communicated with the interior of the housing 10. The opening 111 is close to an optical port 130 of the housing 10, while being spatially spaced apart from the optical port 130. It is worth noting that the present disclosure is not limited by the opening 111 depicted in the drawings. In some cases, the opening may be formed at the lower casing of the housing, or the opening may be communicated with the optical port.

The optical port 130 of the housing 10 may be a slot into which an optical fiber (not shown in the drawings) can be inserted. An optical port connection enables data transfer between an external device (not shown in the drawings) and the optical transceiver 1b via the optical fiber and appropriate cabling. The optical port 130 and the optical fiber allow the optical transceiver 1b to communicate a device over an extended distance.

The circuit board 20 is accommodated in the housing 10, and includes a substrate 210 and one or more heat sources 220. In this embodiment, the heat source 220 is a high power IC chip which generates a large amount of heat during its operation, and the high power IC chip is mounted on the substrate 210. It is worth noting that several other components, such as a vertical cavity surface emitting laser in TOSA, a photodiode in ROSA, or a digital signal processor, with each of which could be another active component, may become the heat source 220 as discussed in the present disclosure.

The first heat spreader 30 is in thermal contact with the heat source 220, and includes a heat transfer portion 310 and a heat dissipation portion 320. The heat transfer portion 310 is accommodated in the housing 10, and the heat dissipation portion 320 is exposed to outside through the opening 111 on the upper casing 110 of the housing 10. In detail, the heat transfer portion 310 of the first heat spreader 30 is located between the heat source 220 and part of the upper casing 110, and the heat source 220 is located between the heat transfer portion 310 and part of the lower casing 120. The upper casing 110 of the housing 10 is in physical contact with the first heat spreader 30. The heat dissipation portion 320 of the first heat spreader 30 sticks out of an end of the heat transfer portion 310 toward the optical port 130 of the housing 10.

In this embodiment, the heat dissipation portion 320 of the first heat spreader 30 is in proximity of the optical port 130 of the housing 10. Herein, said "proximity" can be referred to that the heat dissipation portion 320 is at a position on the housing 10 sufficiently close to the optical port 130 or even located at the optical port 130, such that the heat dissipation portion 320 is not entirely covered by a corresponding cage when the optical transceiver 1b is in the corresponding cage.

The second heat spreader 40 is accommodated in in the housing 10. The first heat spreader 30 is supported on the second heat spreader 40 and in thermal contact with the second heat spreader 40. In this embodiment, each of the first heat spreader 30 and the second heat spreader 40 may be manufactured by having a metal sheet (metallic component) stamped or punched. The metal sheet could be a copper sheet, an aluminum sheet, a nickel sheet and/or alloys thereof. In some cases, the first heat spreader 30 and the second heat spreader 40 may be made of the same material so that both of them are associated with substantially same thermal conductivity.

In this embodiment, a vertical distance H1 between the heat dissipation portion 320 of the first heat spreader 30 and the substrate 210 of the circuit board 20 is greater than a vertical distance H2 between the heat transfer portion 310 and the substrate 210. More specifically, the vertical distance H1 is from a top surface of the heat dissipation portion 320 to a top surface of the substrate 210, and the vertical distance H2 is from a top surface of the heat transfer portion 310 to the top surface of the substrate 210. As shown in FIG. 5, a lower heat transfer portion 310 can improve or enhance compactness of the optical transceiver 1b.

In this embodiment, each of the first heat spreader 30 and the second heat spreader 40 may include one or more protrusions. As shown in FIG. 4 and FIG. 5, a protrusion 330 of the first heat spreader 30 extends toward the lower casing 120 of the housing 10, and a protrusion 410 of the second heat spreader 40 extends toward the upper casing 110 of the housing 10. In short, the protrusions 330 and 410 in this embodiment extend toward each other and in opposite directions. The protrusion 330 of the first heat spreader 30 is in thermal contact with the protrusion 410 of the second heat spreader 40.

In this embodiment, the optical transceiver 1b may include one or more thermal conductive pads 50 squeezed between the protrusion 330 of the first heat spreader 30 and the protrusion 410 of the second heat spreader 40. The thermal conductive pad 240, for example, is a graphite sheet or a thermal paste.

Figure 6:
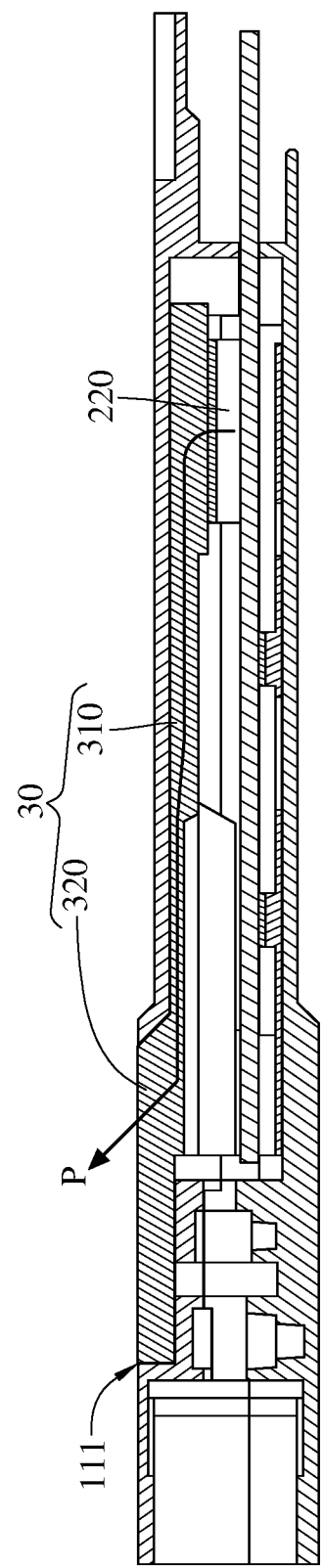
FIG. 6 is a schematic view showing heat transfer path of the optical transceiver in FIG. 5.

FIG. 6 is a schematic view showing a heat transfer path of the optical transceiver in FIG. 5. The heat transfer path from the heat source 220 to the heat dissipation portion 320 of the first heat spreader 30 is shown in FIG. 6. The heat source 220 generates heat during its operation, and such heat is transferred through the heat transfer portion 310 to reach the heat dissipation portion 320 exposed to outside through the opening 111 (referred to the path P).

The configuration of the first heat spreader 30 is favorable for heat transfer. In one implementation, the first heat spreader 30 may be of higher thermal conductivity than the housing 10, so as to enhance the heat dissipation efficiency. Moreover, the heat dissipation portion 320 of the first heat spreader 30, which is exposed to outside, could help the heat transfer from the first heat spreader 30 to air.

Figure 7:
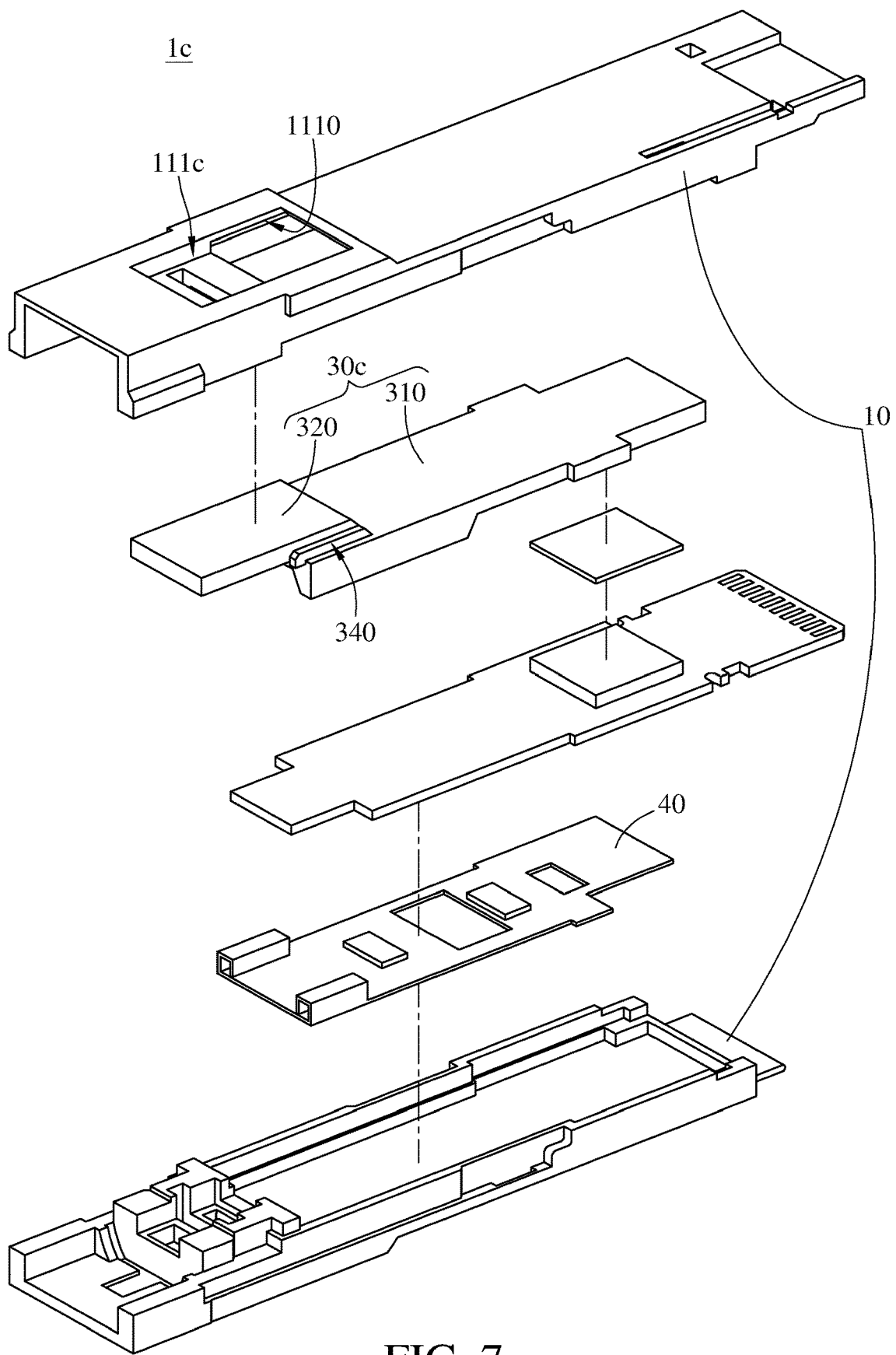
FIG. 7 is an exploded view of an optical transceiver according to still another embodiment of the present disclosure.
Figure 8:
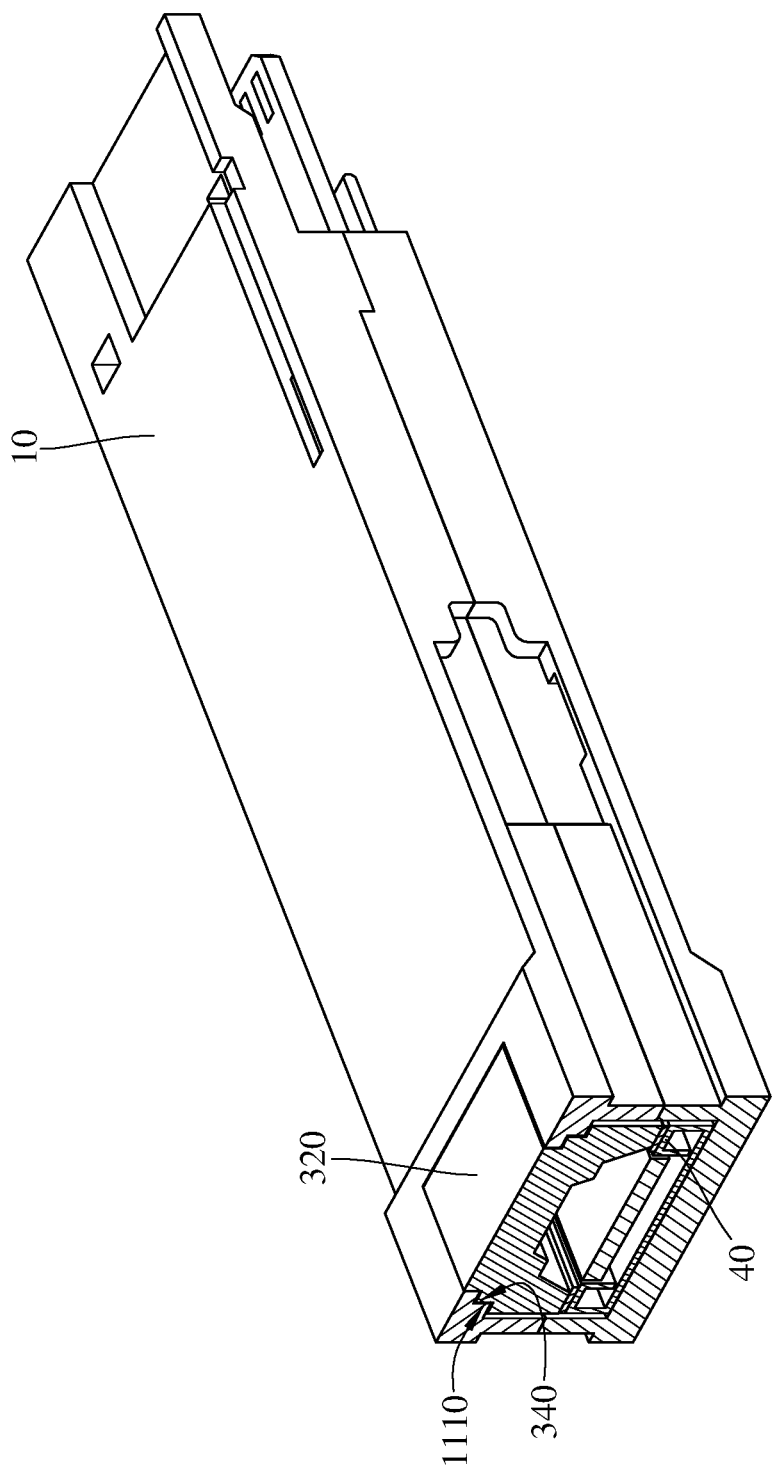
FIG. 8 is a cross-sectional view of the optical transceiver in FIG. 7.

According to the present disclosure, the heat spreader may include electromagnetic shielding structure. Please refer to FIG. 7 and FIG. 8. FIG. 7 is an exploded view of an optical transceiver according to still another embodiment of the present disclosure. FIG. 8 is a cross-sectional view of the optical transceiver in FIG. 7. In this embodiment, an optical transceiver 1c may include a housing 10, a first heat spreader 30c and a second heat spreader 40. An opening 111c may be formed at the housing 10, and the opening 111c is close to an optical port 130 of the housing 10.

The first heat spreader 30c may include an electromagnetic shielding structure 340 extending through the heat transfer portion 310 and the heat dissipation portion 320. More specifically, the electromagnetic shielding structure 340 extends along edges of the heat transfer portion 310 and the heat dissipation portion 320. The electromagnetic shielding structure 340 may be fitted into a counterpart structure 1110 formed at the opening 111c. In this embodiment, the electromagnetic shielding structure 340 and the counterpart structure 1110 are both step-shaped.

Figure 9:
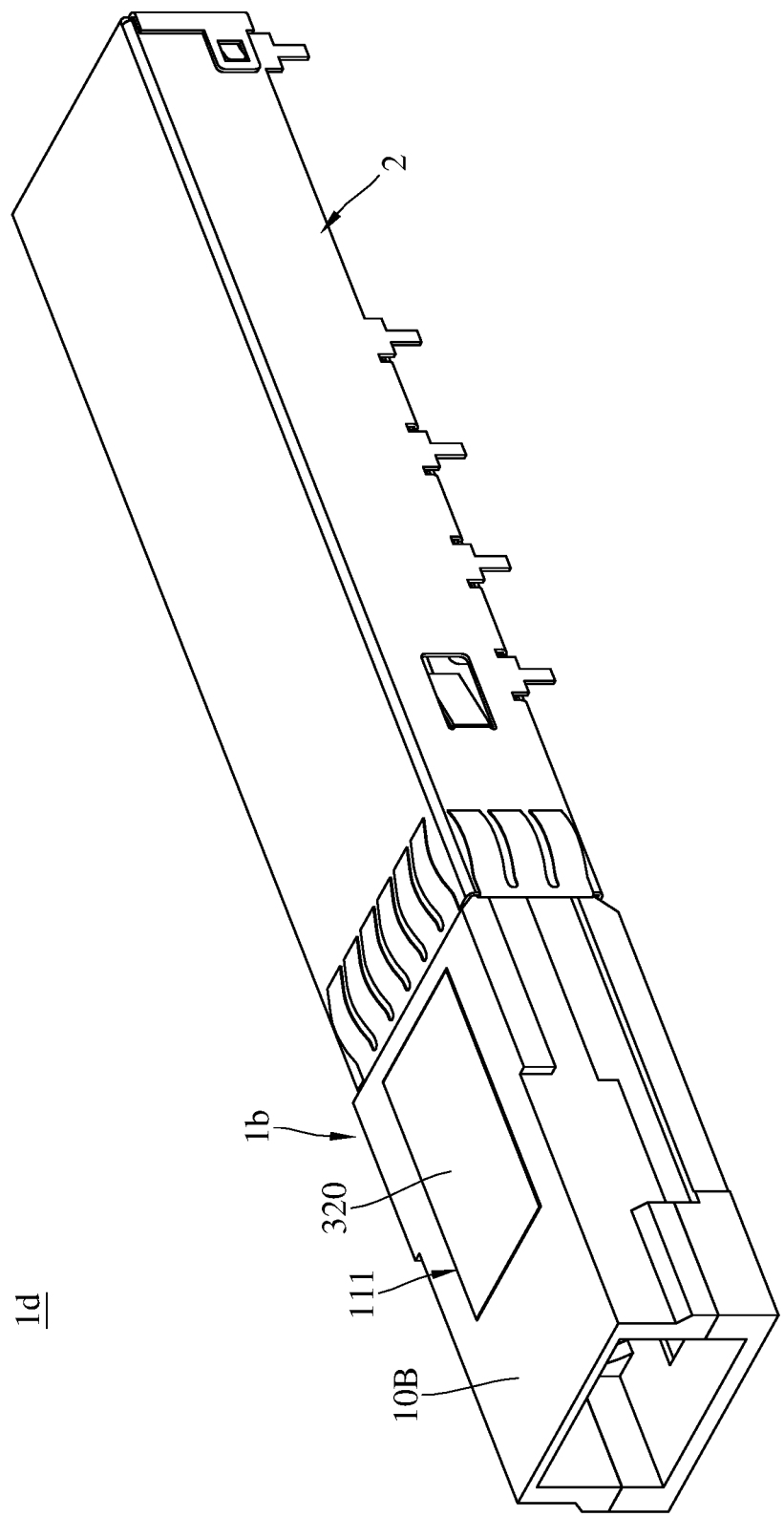
FIG. 9 is a perspective view of an optical communication device according to yet another embodiment of the present disclosure.
Figure 10:
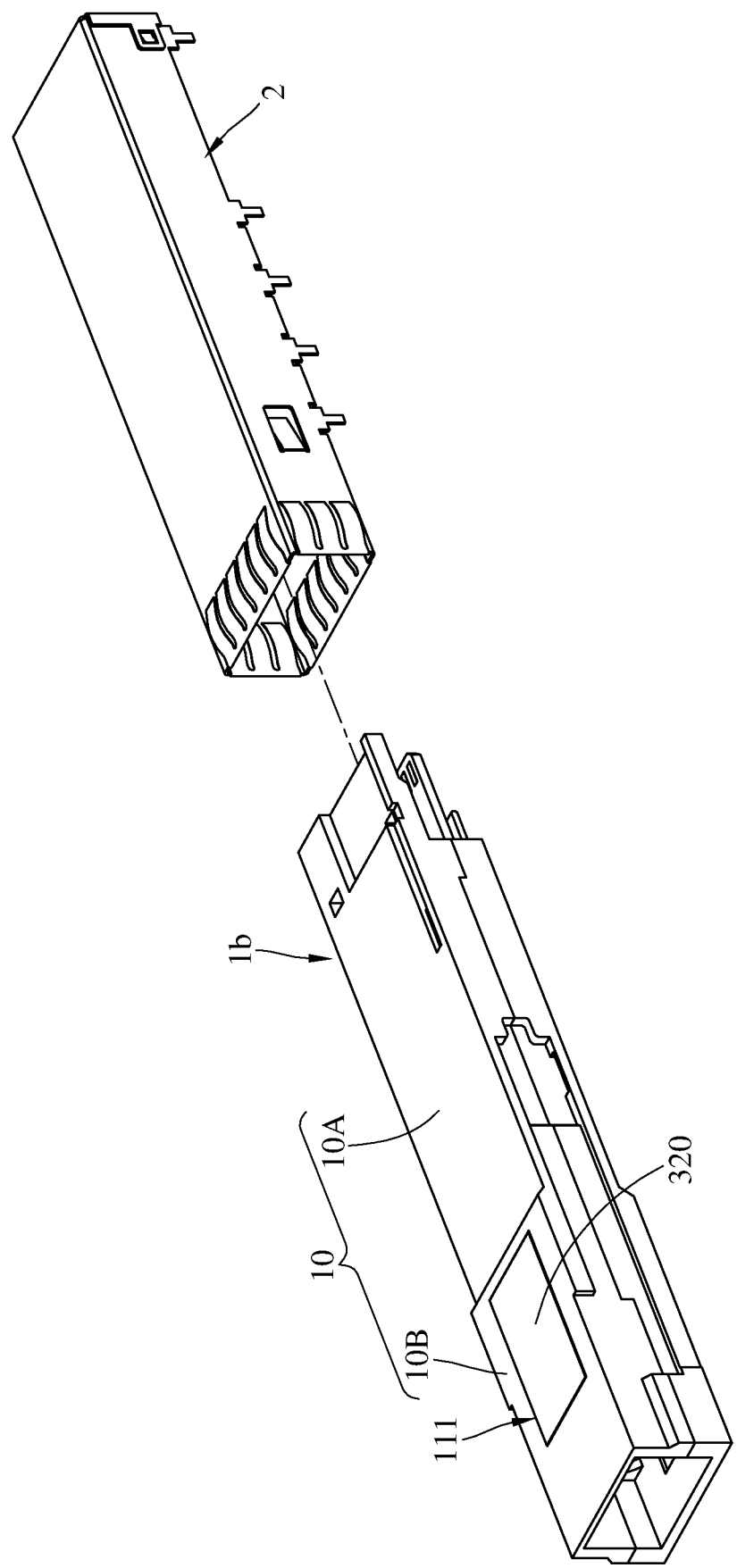
FIG. 10 is an exploded view of the optical communication device in FIG. 9.

The optical transceiver of the present disclosure is applicable to optical communication. Please refer to FIG. 9 and FIG. 10. FIG. 9 is a perspective view of an optical communication device according to yet another embodiment of the present disclosure. FIG. 10 is an exploded view of the optical communication device in FIG. 9. In this embodiment, an optical communication device 1d may include the optical transceiver 1b shown in FIG. 3 through FIG. 6, or the optical transceiver 1c shown in FIG. 7 and FIG. 8. The optical transceiver 1b or 1c can be inserted into a corresponding cage 2 in a pluggable manner. The optical transceiver 1b inserted into the cage 2 are exemplarily depicted in FIG. 9 and FIG. 10.

The housing 10 is partially located in the cage 2. Specifically, the housing 10 may define a main portion 10A in the cage 2 and an end portion 10B outside the cage 2. The heat dissipation portion 320 of the first heat spreader 30 is located at the end portion 10B of the housing 10. In other words, the opening 111 and the optical port 130 are at the end portion 10B. As shown in FIG. 9, when the optical transceiver 1b is inserted in the cage 2, at least part of the end portion 10B is not covered by the cage 2, and the dissipation portion 320 is exposed to outside though the opening 111.

According to the present disclosure, a heat source of the optical transceiver is in thermal contact with a heat spreader which includes a heat dissipation portion exposed to outside through an opening in the proximity of an optical port. The configuration of the present disclosure meets the requirements of different form factors, and the exposed heat dissipation portion could help the heat transfer from the heat spreader to air, thereby enhancing heat dissipation efficiency.

The embodiments are chosen and described in order to best explain the principles of the present disclosure and its practical applications, to thereby enable others skilled in the art to best utilize the present disclosure and various embodiments with various modifications as are suited to the particular use being contemplated. It is intended that the scope of the present disclosure is defined by the following claims and their equivalents.

What is claimed is:

1. An optical communication device, comprising:
   a cage; and
   an optical transceiver disposed in the cage in pluggable manner, the optical transceiver comprising:
   a housing in the cage, the housing comprising a main portion in the cage and an end portion outside the cage, the end portion including an optical port and an opening spaced apart from the optical port;
   a heat source accommodated in the housing; and
   a heat spreader comprising a heat transfer portion accommodated in the housing and a heat dissipation portion exposed to outside the housing, wherein the heat spreader is in thermal contact with the heat source with the heat transfer portion between the heat source and the housing, and the heat dissipation portion of the heat spreader is located at the end portion of the housing;
   wherein the heat dissipation portion of the heat spreader is exposed to outside through the opening.

2. The optical communication device according to claim 1, wherein the heat spreader comprises an electromagnetic shielding structure fitted into a counterpart structure formed at the opening.

3. The optical transceiver according to claim 2, wherein the electromagnetic shielding structure extends through the heat transfer portion and the heat dissipation portion of the heat spreader.

4. The optical transceiver according to claim 2, wherein the electromagnetic shielding structure of the heat spreader is step-shaped.

5. The optical communication device according to claim 1, wherein the optical transceiver further comprises a circuit board accommodated in the housing, the circuit board comprises a substrate and the heat source mounted on the substrate, and a vertical distance between the heat dissipation portion of the heat spreader and the substrate is greater than a vertical distance between the heat transfer portion of the heat spreader and the substrate.

6. The optical transceiver according to claim 1, wherein the heat source is a vertical cavity surface emitting laser, a photodiode or an IC chip.

7. An optical transceiver, comprising:
   a housing comprising an end portion including an optical port and an opening spaced apart from the optical port;
   a heat source accommodated in the housing; and
   a first heat spreader comprising a heat transfer portion accommodated in the housing and a heat dissipation portion exposed to outside, wherein the first heat spreader is in thermal contact with the heat source, and the heat dissipation portion of the first heat spreader is in proximity of the optical port of the housing;
   wherein the heat dissipation portion of the first heat spreader is exposed to outside through the opening;
   wherein the first heat spreader comprises an electromagnetic shielding structure fitted into a counterpart structure formed at the opening, and the electromagnetic shielding structure of the first heat spreader is step-shaped.

8. The optical transceiver according to claim 7, wherein the electromagnetic shielding structure extends through the heat transfer portion and the heat dissipation portion of the first heat spreader.

9. The optical transceiver according to claim 7, further comprising a circuit board accommodated in the housing, wherein the circuit board comprises a substrate and the heat source mounted on the substrate, and a vertical distance between the heat dissipation portion of the first heat spreader and the substrate is greater than a vertical distance between the heat transfer portion of the first heat spreader and the substrate.

10. The optical transceiver according to claim 7, wherein the heat dissipation portion of the first heat spreader sticks out of an end of the heat transfer portion toward the optical port of the housing.

11. The optical transceiver according to claim 7, wherein the housing comprises an upper casing and a lower casing assembled together, the first heat spreader is located between the heat source and part of the upper casing, the heat source is located between the first heat spreader and part of the lower casing, and the upper casing is in physical contact with the first heat spreader.

12. The optical transceiver according to claim 7, further comprising a second heat spreader accommodated in the housing, wherein the first heat spreader is in thermal contact with the second heat spreader.

13. The optical transceiver according to claim 12, wherein the first heat spreader is supported on the second heat spreader.

14. The optical transceiver according to claim 7, wherein the heat source is a vertical cavity surface emitting laser, a photodiode or an IC chip.

* * * * *